(12) United States Patent
Tokushige (10) Patent No.: US 6,888,234 B2
(45) Date of Patent: May 3, 2005

(54) SEMICONDUCTOR DEVICE AND MANUFACTURING METHOD FOR THE SAME

(75) Inventor: Nobuaki Tokushige, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/405,939

(22) Filed: Apr. 3, 2003

(65) Prior Publication Data

US 2003/0227088 A1 Dec. 11, 2003

(30) Foreign Application Priority Data

Apr. 5, 2002 (JP) ........................................ 2002-104374

(51) Int. Cl.$^7$ .............................................. H01L 23/48
(52) U.S. Cl. ...................................... 257/688; 257/181
(58) Field of Search ................................ 257/688, 181, 257/689, 669

(56) References Cited

U.S. PATENT DOCUMENTS

| 5,256,562 A | 10/1993 | Vu et al. |
| 5,789,792 A | 8/1998 | Tsutsumi |
| 6,454,395 B1 * | 9/2002 | Irinoda .......................... 347/54 |

| 2002/0005594 A1 | 1/2002 | Iwamatsu |
| 2002/0030189 A1 | 3/2002 | Ishikawa |
| 2002/0031897 A1 | 3/2002 | Ueda et al. |

FOREIGN PATENT DOCUMENTS

| EP | 0 325 704 A2 | 8/1989 |
| EP | 0 368 584 A2 | 5/1990 |

OTHER PUBLICATIONS

Sheraw et al, "Organic Thin–Film Transistor–Driven Polymer–Dispersed Liquid Crystal Displays on Flexible Polymeric Substrates", American Institute of Physics, Appl. Phys. Lett.vol. 80, No. 6, Feb. 11, 2002, pp. 1088–1090.
European Search Report mailed Mar. 8, 2004 in corresponding EP application No. 03007696.2–1528.

* cited by examiner

*Primary Examiner*—Phat X. Cao
(74) *Attorney, Agent, or Firm*—Nixon & Vanderhye P.C.

(57) ABSTRACT

A semiconductor device comprising a semiconductor layer and one, or a plurality of, semiconductor elements formed on a surface of the semiconductor layer, characterized in that said semiconductor layer is divided into a plurality of pieces in a region wherein said semiconductor layer does not have a semiconductor element and in that the respective pieces of the divided semiconductor layer have a flexible region made of an insulating layer adhered to the sides of the respective pieces so that the pieces are integrated.

7 Claims, 6 Drawing Sheets

SEMICONDUCTOR DEVICE AND MANUFACTURING METHOD FOR THE SAME

CROSS-REFERENCE TO RELATED APPLICATION

This application is related to Japanese Patent Application No. 2002-104374 filed on Apr. 5, 2002, whose priority is claimed under 35 USC § 119, the disclosure of which is incorporated by reference in its entirety.

BACKGROUND OF THE INVENTION

1. Field of the Invention

The present invention relates to a semiconductor device and a manufacturing method for the same, in particular, to a flexible semiconductor device and manufacturing method for the same.

2. Description of the Background Art

The trend toward miniaturization and greater portability of apparatuses such as cellular phones has been increasing and, in addition, wearable computers have appeared that are "personal computers that can be worn on a human body."

In addition, interfaces for directly sensing images and sounds, such as a 3DMD (see-through head-mounted display), a CCD camera with a built-in HD, an earphone-type monocle, an earphone-type microphone have been proposed and the market for wearable apparatuses is expected to expand in the future.

A method wherein a TFT chip of an AMLCD (active matrix display) can be formed within a thin film has been proposed as one of the measures necessary to meet this demand (for example, in U.S. Pat. No. 5,256,562).

Figure 5A:
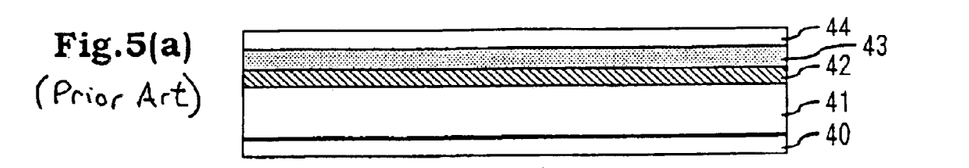
FIGS. 5(a) to 5(h) are schematic cross sectional views of a main portion of a semiconductor device in accordance with the steps of a manufacturing method for a semiconductor device according to the prior art.
Figure 5B:
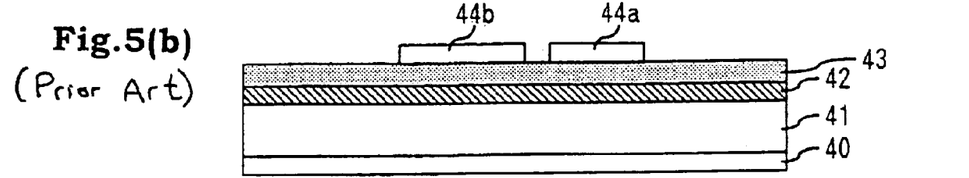

According to this method, first, as shown in FIG. 5(a), an SOI structure substrate is prepared by layering, in the following order, a Si buffer layer 41, a silicon oxide film 42 according to a CVD method, a release layer 43 formed of a silicon oxide nitride film and an upper silicon layer 44 that becomes an element formation layer on a Si substrate 40 and, as shown in FIG. 5(b), a pixel region 44b as well as a TFT region 44a of an AMLCD are formed.

Figure 5C:
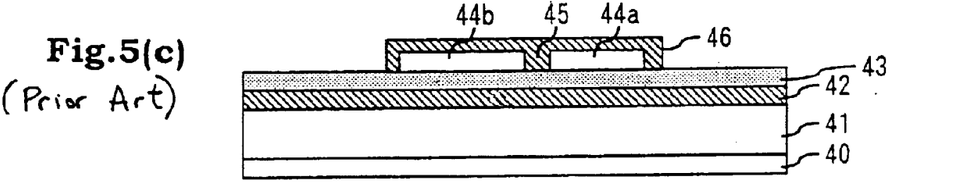

Next, as shown in FIG. 5(c), an insulator region 45 is formed and an oxide film 46 is formed on pixel region 44b and on TFT region 44a.

Figure 5D:
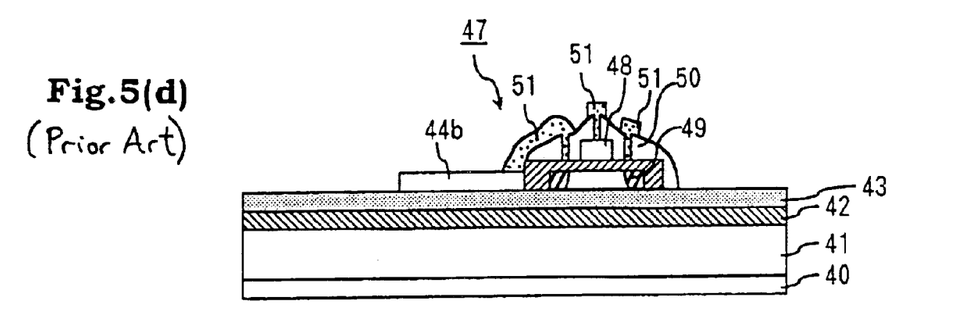

Furthermore, as shown in FIG. 5(d), a gate electrode 48 and source/drain regions 49 are formed in the gained substrate and, in addition, these are covered with an insulating film 50 and, then, contact holes and wires 51 are created in desired regions of insulating film 50 so that a TFT 47 is gained.

Figure 5E:
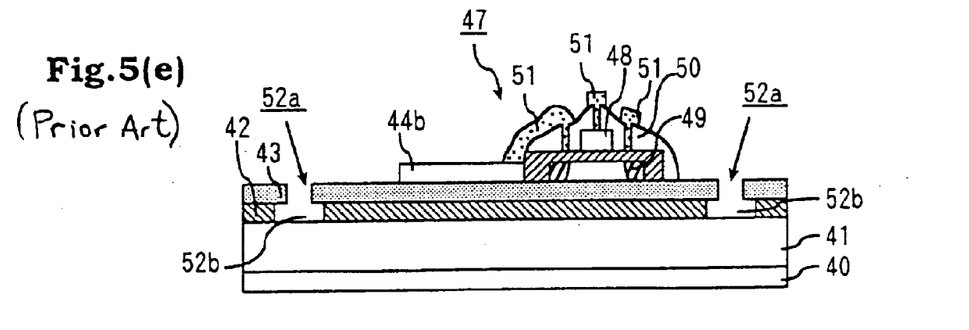

After that, as shown in FIG. 5(e), an opening 52a is created in the release layer 43 outside of the region that includes pixel region 44b and TFT region 44a and, furthermore, an opening 52b, which is larger than this opening 52a, is created in the silicon oxide film 42.

Figure 5F:
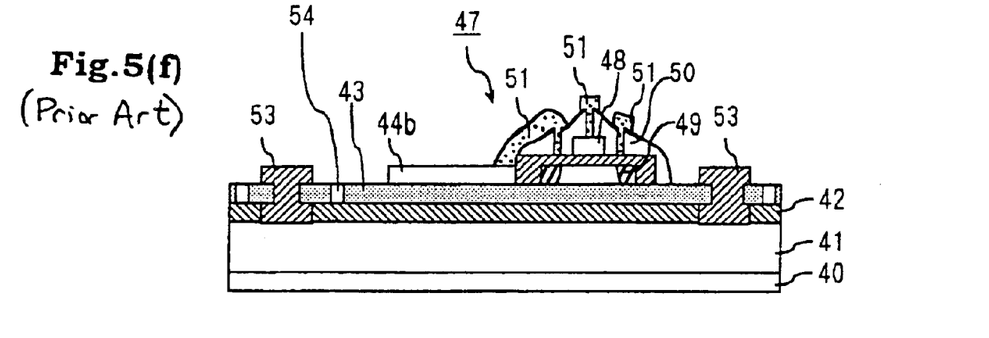
Figure 5G:
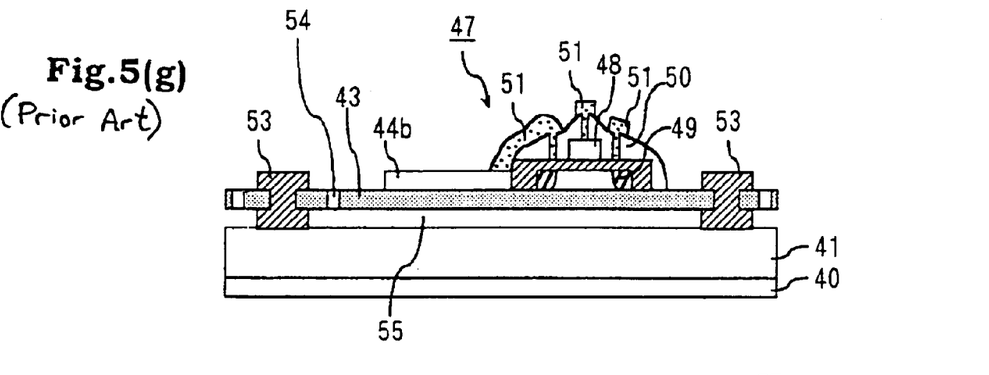

Subsequently, as shown in FIG. 5(f), a support pillar 53 that fills in the openings of the silicon oxide film 42 and the release layer 43 is formed of a silicon oxide film, and an etchant introduction opening 54 is created in the release layer 43 in the region between the support pillars 53 other than the regions of the pixel region 44b and the TFT region 44a so that an etchant is introduced through this etchant introduction opening 54 and, thereby, the silicon oxide film 42 is etched and removed so as to create a cavity 55, as shown in FIG. 5(g). Thereby, the pixel region 44b and the TFT 47 are placed on the release layer 43, supported by the support pillar 53.

Figure 5H:
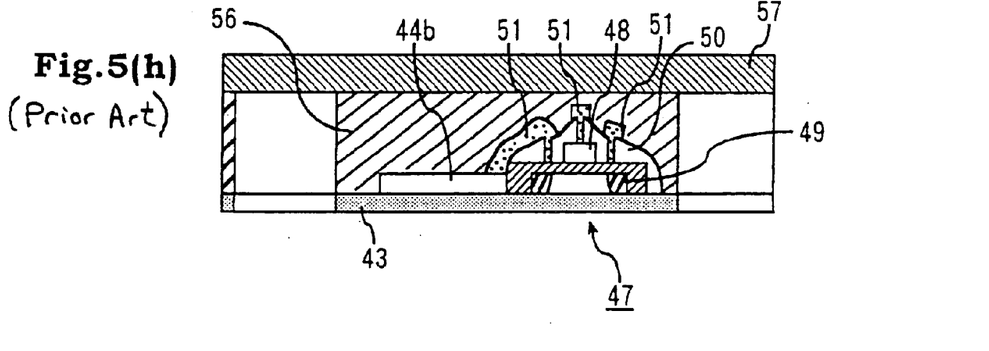

Next, as shown in FIG. 5(h), an epoxy resin 56 and a non-photosensitive transparent resin film 57 are formed on the entire surface of the gained substrate and, then, the epoxy resin 56, which is over the pixel region 44b and the TFT 44a, is hardened through irradiation by ultraviolet rays and the epoxy resin that is not hardened is removed so that a chip in a thin film form is released by a cleaving action of the support pillar 53.

A chip in a thin film form fabricated in the above described manner, however, lacks flexibility, lacks ductility and is fragile. In addition, it is difficult to apply such a chip in a layered structure used for a system having multiple functions.

SUMMARY OF THE INVENTION

The present invention is provided in view of such a problem and a purpose thereof is to provide a semiconductor device and a manufacturing method for the same wherein a chip, itself, in a thin film form is produced to be flexible.

According to the present invention, a semiconductor device formed of a semiconductor layer and one, or a plurality of, semiconductor elements formed on the surface of the semiconductor layer is provided wherein the above described semiconductor layer is divided into a plurality of pieces in a region wherein the above described semiconductor layer does not have a semiconductor element and the respective pieces of the divided semiconductor layer have a flexible region made of an insulating layer adhered to the sides of the respective pieces so that the pieces are integrated.

In addition, according to another aspect, the present invention provides a semiconductor device having: rigid regions wherein one, or a plurality of, semiconductor elements is formed on the surface of a semiconductor layer; and a flexible region wherein a semiconductor element is not placed in the surface of the above described semiconductor layer so that the flexible region is provided with semiconductor layers and insulating layers adhered to each other in an alternating manner.

Furthermore, the present invention provides a manufacturing method for a semiconductor device according to which (a) one, or a plurality of, semiconductor elements is formed on a surface of a substrate having a semiconductor layer on the surface; (b) one, or a plurality of, trenches is created in a region of the above described semiconductor layer wherein a semiconductor element is not formed; (c) an insulating layer is filled in into these trenches so that this insulating layer adheres to the sides of the semiconductor layer; and (d) the above described substrate is made to recede from the rear surface to the bottom of the above described trenches and, thereby, the semiconductor layer is divided into a plurality of pieces and a flexible region is formed in the semiconductor layer so that the respective pieces of the semiconductor layer are integrated by means of the insulating layer.

DETAILED DESCRIPTION OF THE PREFERRED EMBODIMENTS

A semiconductor device according to the present invention is primarily provided with a semiconductor layer and a semiconductor element formed on the semiconductor layer. In addition, this semiconductor device has at least a flexible region and, preferably, has both a flexible region and a rigid region.

As for the semiconductor layer: a semiconductor substrate, itself, may be used; a semiconductor layer formed on a semiconductor substrate (for example, a p type or an n type epitaxial silicon layer of approximately 1 µm is layered on the surface of an n type or a p type silicon substrate, which are so-called epitaxial substrates) may be used; or a semiconductor layer formed on a substrate other than a semiconductor substrate (for example, an SOI substrate) may be used. As for the semiconductor substrate, a variety of substrates, such as element semiconductor substrates of silicon, germanium, or the like, and compound semiconductors of GaAs, InGaAs, or the like, for example, may be used. Among these, a single crystal silicon substrate or a polycrystal silicon substrate is preferable and, in particular, a single crystal silicon substrate is preferable. In addition, it is preferable for the semiconductor layer to specifically have a plane direction of (110). It is preferable for the semiconductor substrate to have a relatively low resistance (for example, approximately 20 Ωcm, or less, and preferably approximately 10 Ωcm) after doping of N type impurities, such as phosphorus, arsenic, or the like, or of P type impurities, such as boron, or the like.

In addition, as for the substrate used in the formation of the SOI substrate, a glass substrate, a crystal glass substrate, a sapphire substrate, a plastic substrate, and the like, in addition to the above described semiconductor substrate can be cited. As for the SOI substrate: a SIMOX (Separation by Implantation of Oxygen)-type substrate wherein a buried oxide film is formed within a semiconductor substrate by implantation of oxygen ions into a semiconductor substrate and by carrying out a heat treatment; a substrate (BESOI substrate) gained by pasting together two semiconductor substrates wherein oxide films are formed on the surfaces by means of thermal oxidation; a so-called pasted-type SOI substrate wherein a semiconductor substrate on the surface of which an oxide film is formed by means of thermal oxidation or epitaxial growth is pasted to an SOI substrate wherein a first insulating layer and a first semiconductor layer are formed by means of epitaxial growth on a semiconductor substrate; a substrate wherein an insulating film and a first semiconductor layer are formed by means of epitaxial growth on a semiconductor substrate, or the like, are cited. Here, the semiconductor layer is a semiconductor thin film that functions as an active layer in order for transistors to be formed and can be formed of any of the above described semiconductors. As for the film thickness in this case, a range of from approximately 50 nm to 1000 nm, for example, can be cited. As for the buried insulating film, a silicon nitride film, a silicon oxide nitride film or a layered film of these and a silicon oxide film, in addition to a silicon oxide film, are cited and, as for the film thickness thereof, a range of from approximately 50 nm to 200 nm, for example, can be cited.

Semiconductor elements formed on the semiconductor layer are used for the formation of a variety of circuits, such as a memory, a peripheral circuit, a logic circuit, and the like, and conventionally included a variety of elements, such as transistors, capacitors, resistors, and the like. In addition, a variety of films, such as element isolation films, interlayer insulating films, wire layers, and the like, may be formed in order to separate, or connect, these elements from, or to, each other.

The flexible region is a region wherein the divided pieces of the semiconductor layer are connected to each other by means of an insulating layer that is adhered to the sides of the divided pieces so that the semiconductor layer is integrally formed, in other words, the flexible region indicates a region wherein divided pieces of the semiconductor layer and insulating layers are placed in an alternating manner and make contact with each other so that the substrate (semiconductor layer) has a flexibility in one, or more, directions in the region due to the plasticity, the flexibility, and the like, of the insulating layers. The size of the flexible region is not specifically limited but, rather, can be appropriately adjusted in accordance with the dimensions, functions, applications, or the like, of the semiconductor device to be gained.

The size and form of the divided pieces of the semiconductor layer are not specifically limited but, rather, a variety of plane forms such as a square, a rectangle, a diamond, a triangle, and the like, can be cited and, in the case of a rectangle (stripe form), for example, a range of from approximately 10 nm to 1000 nm is appropriate for the width thereof, and, in the case of a square, a range of from approximately 10 nm to 1000 nm is appropriate for one side thereof. In addition, it is preferable for all of the sides of the divided pieces of the semiconductor layer to be approximately perpendicular to the surfaces and some sides may be inclined so as to be in a tapered form or so as to be in a reverse tapered form on the rear surface sides or on the top surface sides.

Here, it is necessary for the semiconductor layer in the flexible region to be a region that does not affect the characteristics of the semiconductor elements formed on the surface and, in general, it is appropriate for the semiconductor layer to be in the region wherein the semiconductor elements are not formed and, for example, a region, such as a field region, wherein only insulating films are formed can be cited.

The types of insulating layer for integrally connecting the divided pieces of the semiconductor layer or of the insulating layers placed in an alternating manner vis-á-vis the divided pieces of the semiconductor layer are not specifically limited, as long as adhesion to the sides of the divided pieces of the semiconductor layer is ensured, and, for example, a single layer film or a multi-layer film of a silicon oxide film (thermal oxide film, low temperature oxide film: LTO film, or the like, high temperature oxide film: HTO film), a silicon nitride film, a silicon oxide nitride film, an SOG film, a PSG film, a BSG film, a BPSG film, a PZT, a PLZT, a ferroelectric film, an antiferroelectric film, or the like, can be cited. The film thickness thereof is not specifically limited and can be appropriately adjusted depending on the thickness of the divided pieces of the semiconductor layer, the size of the semiconductor device and the degree of flexible to be gained. A range of from approximately 50 nm to 2000 nm, for example, can be cited. In addition, it is preferable for the insulating layer to have recesses created in the surface thereof between the divided pieces of the semiconductor layer and the deeper the recesses are, that is to say, the lesser the film thickness of the insulating film is, the greater is the flexibility that can be gained.

Figure 2A:
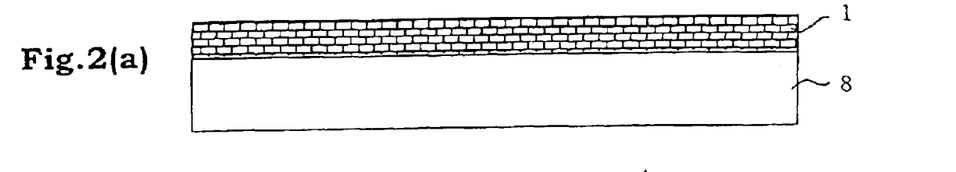
FIGS. 2(a) to 2(g) are schematic cross sectional views of a main portion of a semiconductor device in accordance with the steps of a manufacturing method for a semiconductor device according to a second embodiment of the present invention.
Figure 2B:
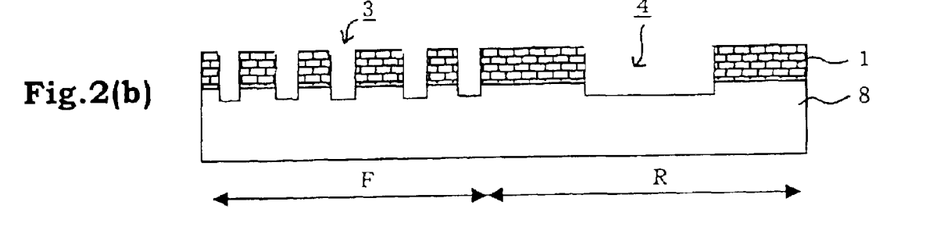
Figure 2C:
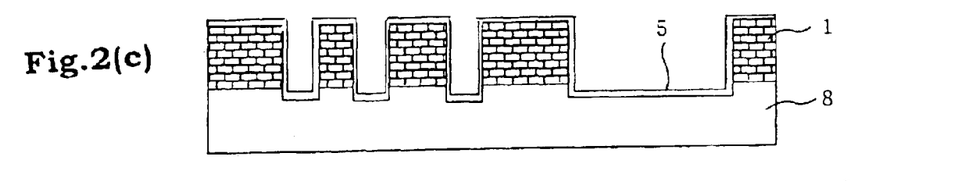
Figure 2D:
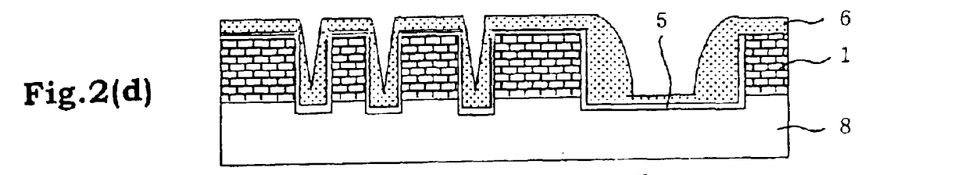
Figure 2E:
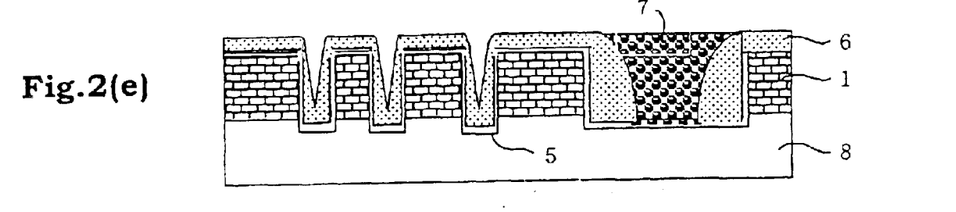
Figure 2F:
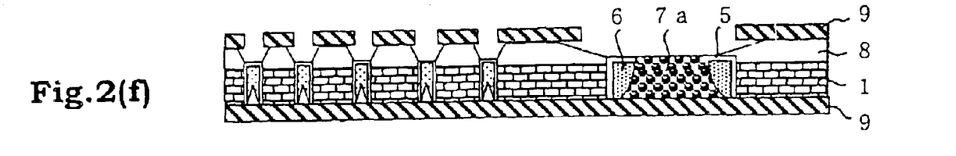
Figure 2G:
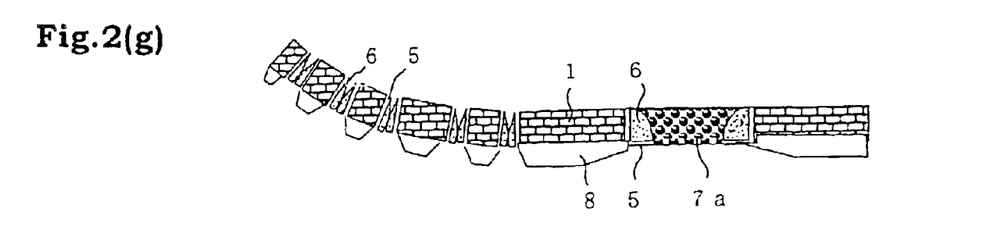

It is necessary for the insulating layer to adhere to the sides of the pieces of the semiconductor layer to a degree sufficient so that a plurality of pieces of semiconductor layer can be integrally combined and it is not necessary for the insulating layer to adhere to the entirety of the surfaces of the sides of the pieces of the semiconductor layer. That is to say, in the case wherein the sides of the pieces of the semiconductor layer are approximately perpendicular to the top and bottom surfaces, it is preferable for the insulating layer to adhere to the entirety of the surfaces of the sides while, for example, in the case wherein either the top portions or the bottom portions of the sides are inclined relative to the upper and lower planes, the insulating layer need not adhere to the inclined portions of the sides. Here, the inclination of the sides of the pieces of the semiconductor layer may be in a tapered form or may be in a reversed tapered form and it is preferable for portions of the sides to be inclined so that the amount of increase in the size of gaps between the pieces of the semiconductor layer becomes greater the closer is the position to the bottom surface side, as shown in FIGS. 2(f) and 2(g). That is to say, the surface of the regions wherein the flexible region, the pieces of the semiconductor layer and the insulating layers are provided may be uneven.

In addition, it is preferable for a rigid region, in addition to the above described flexible region, to be formed in a semiconductor layer. A rigid region indicates a region that does not bend and that is stiff and not flexible and includes a region wherein a feedthrough electrode is formed to extend from the top surface of the semiconductor layer to the bottom surface of the semiconductor layer. The insulating layer adheres to the sides, in a tapered form, in a reversed tapered form or in a right angled form, of each of the divided pieces of the semiconductor layer and, in addition, the feedthrough electrode that penetrates from the top surface to the bottom surface of the semiconductor layer is placed so as to adhere to this insulating layer. Here, as for the insulating layer, the same types as described above can be cited.

The feedthrough electrode can be formed of any material, as long as it is formed of a conductive layer that can adhere to the insulating layer. For example, the feedthrough electrode can be formed of a single layer film or a multi-layer film of an N type, or a P type, amorphous, single crystal or polycrystal element semiconductor (such as silicon or germanium, for example) or a compound semiconductor (such as GaAs, InP, ZnSe, or CsS, for example), a metal such as gold, platinum, silver, copper, aluminum, Ru, or the like, a high melting point metal such as titanium, tantalum, tungsten, or the like, a silicide or a polycide including a high melting point metal, a nitride such as TiN, tungsten nitride, or the like, a transparent conductive material such as CuI, ITO, $SnO_2$, ZnO, or the like. In particular, a high melting point metal is preferable.

According to a manufacturing method for a semiconductor device of the present invention, first, in Step (a), one, or a plurality of, semiconductor elements is formed in the surface of a substrate having a semiconductor layer on the surface. Here, the substrate having a semiconductor layer may be simply a semiconductor substrate or may be an SOI substrate, as described above. The semiconductor elements can be formed through a combination of a variety of methods that are well-known in this field. Here, it is preferable to cover the semiconductor elements with an interlayer insulating film, or with a protective film, after the formation of the semiconductor elements.

In Step (b), one, or a plurality of trenches, is created in the semiconductor layer in a region wherein the semiconductor elements are not formed. The trenches can be created by forming a mask pattern in a predetermined form according to photolithographic and etching steps and by carrying out anisotropic etching (for example, reactive ion etching (RIE)) using this mask pattern. Here, though the dimensions, the form and the depth of the trenches are not particularly limited, the depth of the trenches determines the thickness of the flexible semiconductor device that is gained as the final product and it is appropriate for the depth to be greater than the total thickness, for example, from approximately 1 $\mu$m to 10 $\mu$m, of, at least, the semiconductor elements (including the interlayer insulating film or the protective film in the case wherein it covers the semiconductor elements) and the semiconductor layer having a thickness sufficient for the formation of a portion of the elements and for supporting the elements. Here, in the case wherein an SOI substrate is used for the substrate, it is preferable for the trenches to have a depth sufficient so that the trenches penetrate through the semiconductor layer on the surface of the SOI substrate. In addition, as for the width, it is appropriate for the width of the semiconductor layer/width of trenches to be from approximately 1 $\mu$m to 100 $\mu$m/from approximately 1 $\mu$m to 100 $\mu$m. In addition, though the trenches may be created in only the region wherein an insulating layer is provided in the flexible region in the subsequent steps, it is preferable for the trenches, also, to be created in the region wherein feedthrough electrodes are provided in the rigid regions. As for the form of the trenches in the flexible region, a stripe form, a grid form, or the like, for example, are appropriate while the trenches in the rigid regions may have any form, such as a circular form or a polygonal form, and it is preferable to adjust the dimension of the trenches so that the feedthrough electrodes formed of a conductive layer buried within the trenches to have appropriate resistance values.

In Step (c) an insulating layer is buried in the trenches. The insulating layer can be formed of any of the above described materials and, in particular, a layered film of a silicon nitride film and a silicon oxide film is preferable. The insulating layer can be formed according to a thermal oxidation method, a sputtering method, a variety of CVD methods, an EB method, and the like. Thereby, the insulating layer can be made to adhere to the sides of the semiconductor layer.

Here, in this step, in the case wherein feedthrough electrodes are formed in the rigid regions, it is appropriate for the trenches in the rigid regions to be filled in with the insulating layer to the degree wherein the sides of the trenches are covered with the insulating layer in a tapered form, in a reversed tapered form or in a right angled form. In addition, after the insulating layer is filled in into the trenches, the trenches in the rigid regions are filled in with a conductive layer. The method for filling in the conductive layer is not particularly limited but, rather, a method for making a conductive layer selectively grow only within the trenches, a method for covering the region other than the trenches for the feedthrough electrodes with a photoresist and for forming a conductive layer on the entire surface of the substrate using this photoresist and, then, for carrying out etch back or a liftoff process, or a method wherein these are combined, for example, can be cited. Thereby, an insulating layer can be made to adhere to the inside of the trenches for the feedthrough electrodes and, in addition, a conductive layer can be made to adhere to this insulating layer so that, as described below, rigid regions integrated with the feedthrough electrodes, extending from top surface to the rear surface of the semiconductor layer, can be formed.

In Step (d), the substrate is made to recede from the rear surface side to the bottom of the trenches. The process to cause the substrate to recede here can be achieved using a variety of methods including wet etching, dry etching or polishing, such as by a CMP method. A mask for covering predetermined regions may be used at the time when the substrate is made to recede. It is preferable to use, for example, a mask in the same form as the mask pattern when the trenches are created, as described above, at the time the substrate is made to recede. In particular, in the case wherein a substrate having the (110) plane direction is used, the (100) surface and the (110) surface, for example, have a difference in etching rate when wet etching is carried out using an alkaline solution and, therefore, this phenomenon is utilized so that etching can proceed so that the desired form is created. Here, as for the alkaline solution, solutions of KOH, TMAH (Tetramethyl ammonium hydroxide), and the like, for example, can be cited. Thereby, a form wherein slits are created in the rear surface of the flexible substrate gained as the final product, a form that is uneven or a form having inclinations in portions of the sides of the individual pieces of the semiconductor layer on the rear surface side can be gained as a result of an easy process and, thereby, a substrate of a comparatively thick film, which can be handled with ease, can be gained while the flexibility is maintained.

In addition, in the case wherein an SOI substrate is used as the substrate, the support substrate and the buried insulating film can easily be made to recede or can be removed from the rear surface side of the substrate and, thereby, the bottoms of the trenches can reach to the rear surface of the substrate so that the semiconductor layer can be divided.

Thereby, the semiconductor layer is divided into a plurality of pieces along the trenches while the respective pieces of the semiconductor layer are connected and integrated by the insulating layer formed in the above described trenches so that this region of the insulating layer forms the flexible region.

In the following, the semiconductor devices and the manufacturing methods for the same according to the present invention are described in detail in reference to the drawings.

Embodiment 1

First, as shown in FIG. 1(*a*), elements are formed on, for example, a p type silicon substrate 2 having an impurity concentration of approximately $5 \times 10^{15}$ cm$^{-3}$ and having the (100) plane direction according to a general method so that an element layer 1 is fabricated.

After that, as shown in FIG. 1(*b*), slits 3 for flexibility and a slit 4 for a feedthrough electrode are created so as to have a depth of from 5 μm to 10 μm and so as to penetrate through the element layer 1 according to, for example, an RIE method. Here, the positions of slits 3 and 4 are positions that do not affect the elements formed in the element layer 1, for example, in the field portions, or the like, of the chip. Thereby, a flexible region F can be formed in the region wherein the slits 3 for flexibility are created and a rigid region R can be formed in the region wherein the elements are formed as well as in the region wherein the slit 4 for the feedthrough electrode is formed.

Next, as shown in FIG. 1(*c*), a SiN film 5 is deposited on the entire surface of the gained silicon substrate 2 so as to have a thickness approximately 1 μm according to, for example, a thermal CVD method or a plasma CVD method and, in addition, a thermal oxide film 6 is formed on top of that so as to have a thickness sufficient to fill in the slits 3 for flexibility and sufficient to be deposited on the sides and bottom of the slit 4 for the feedthrough electrode, that is to say, approximately 10 μm, for example.

Then, as shown in FIG. 1(*d*), the thermal oxide film 6 is etched back so that the bottom of the slit 4 for the feedthrough electrode is exposed. An aluminum film 7 is buried in the slit 4 for the feedthrough electrode.

Next, as shown in FIG. 1(*e*), the top and rear surfaces of the silicon substrate 2 are polished according to, for example, a CMP method so that the substrate is converted to a thin film. At this time, the SiN film 5 formed on the surface of the element layer 1 and formed within the slit 4 for the feedthrough electrode serves as the polishing stopper. Thereby, a flexible substrate with a feedthrough electrode 7*a* is completed, as shown in FIG. 1(*f*).

Figure 1A:
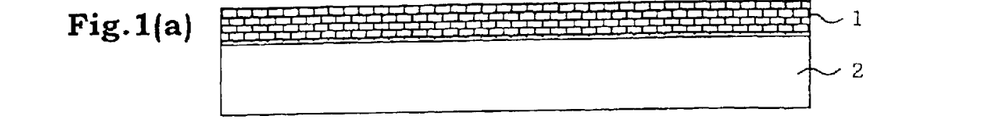
FIGS. 1(a) to 1(g) are schematic cross sectional views of a main portion of a semiconductor device in accordance with the steps of a manufacturing method for a semiconductor device according to a first embodiment of the present invention.
Figure 1B:
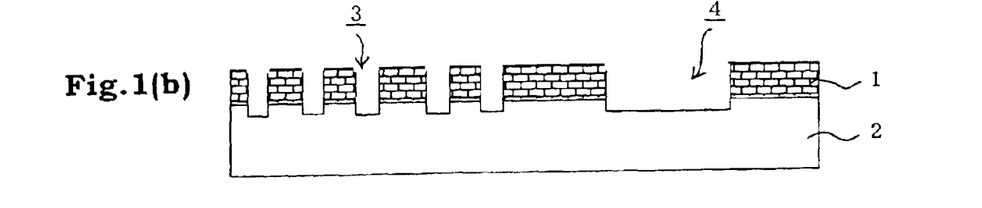
Figure 1C:
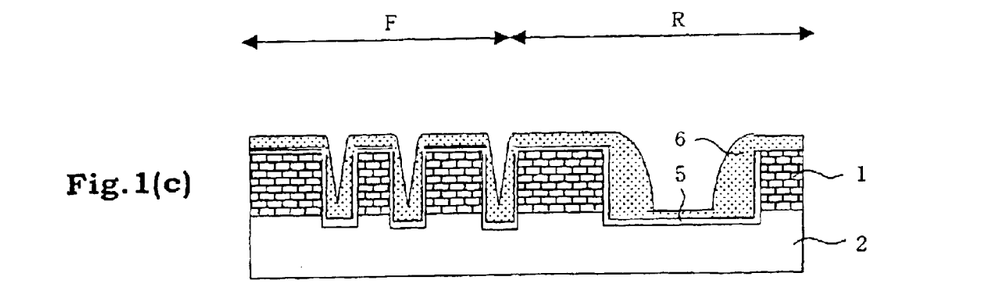
Figure 1D:
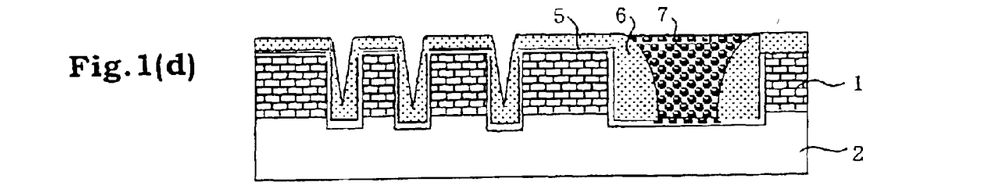
Figure 1E:
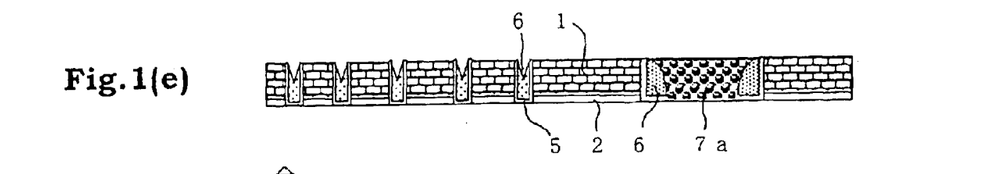
Figure 1F:
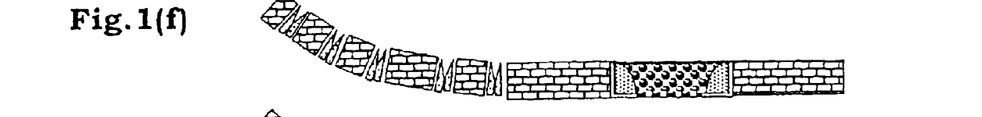
Figure 1G:
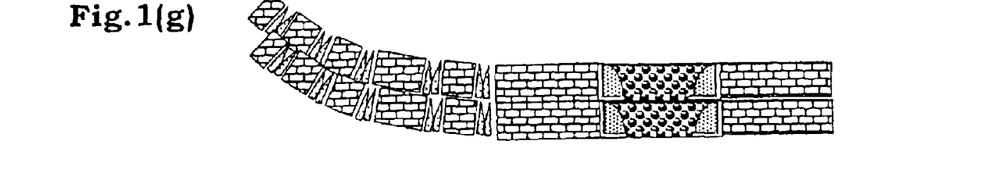

The feedthrough electrode 7*a* can be used for input and output of electrical signals from the rear surface of the chip.

In addition, substrates of the same type as this substrate can be layered and used, as shown in FIG. 1(*g*).

Embodiment 2

First, as shown in FIG. 2(*a*), an element layer 1 is fabricated on a p type silicon substrate 8 having an impurity concentration of approximately $5 \times 10^{15}$ cm$^{-3}$ and having the (110) plane direction in the same manner as described above.

After that, as shown in FIG. 2(*b*), slits 3 for flexibility and a slit 4 for a feedthrough electrode are created according to, for example, a RIE method so as to penetrate through the element layer 1 and so as to have a depth of 5 μm to 10 μm. Here, the positions of the slits 3 and 4 are positions that do not affect the elements formed in the element layer 1, for example, in the field portions, or the like, of the chip. Thereby, a flexible region F and a rigid region R can be formed in the same manner as described above.

Next, as shown in FIG. 2(*c*), a SiN film 5 is deposited on the entire surface of the gained silicon substrate 2 so as to have a thickness of approximately 1 μm according to, for example, a thermal CVD method or a plasma CVD method and, in addition, a thermal oxide film 6 is formed on top of that so as to have a thickness sufficient to fill in the slits 3 for flexibility and sufficient to be deposited on the sides and the bottom of the slit 4 for the feedthrough electrode of, approximately, 10 μm, as shown in FIG. 2(*d*).

Then, as shown in FIG. 2(*e*), the thermal oxide film 6 is etched back so as to expose the bottom of the slit 4 for the feedthrough electrode and an aluminum film 7 is filled in into the slit 4 for the feedthrough electrode.

Next, the surface of the silicon substrate 8 is polished according to, for example, a CMP method so that the substrate is converted to a thin film and so that a feedthrough electrode 7*a* is formed. At this time, the SiN film 5 formed on the surface of the element layer 1 serves as the polishing stopper.

Figure 3:
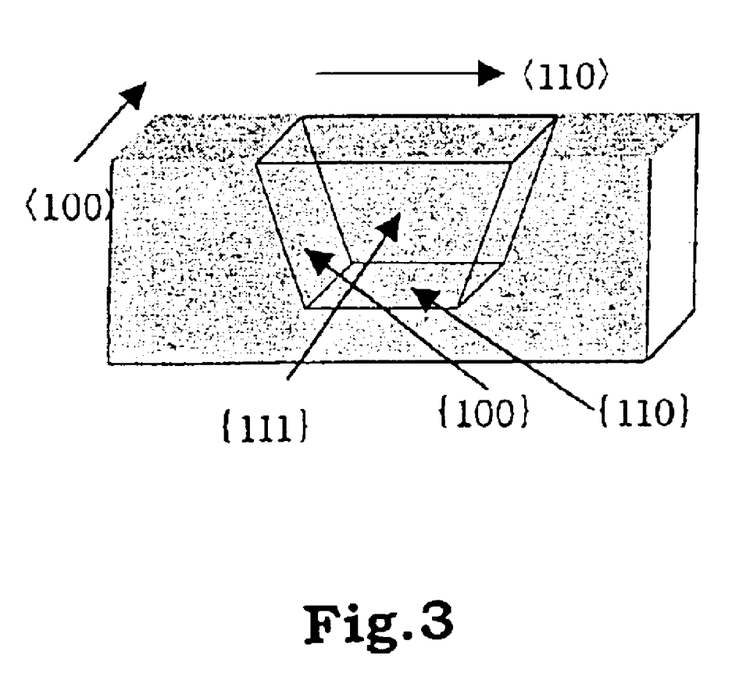
FIG. 3 is a diagram of a main portion for describing a method for making the back surface of the substrate recede according to the manufacturing method for a semiconductor device of the present invention.

Next, as shown in FIG. 2(*f*), a photoresist is applied to the top and rear surfaces of the silicon substrate 8 and the photoresist on the rear surface is patterned by utilizing, for example, a photomask used for the creation of the slits 3 for flexibility and the slit 4 for the feedthrough electrode in FIG. 2(*b*). The gained resist pattern 9 is used as a mask so that anisotropic etching is carried out on the rear surface of the silicon substrate 8 using a KOH solution of from 33 wt. % to 35 wt. %. At this time, the form of the resist pattern 9 corresponds to the form of slits 3 and 4 and, therefore, the SiN film 5 can be utilized as the etching stopper in regard to the etching from the rear surface of the silicon substrate 8. At this time, the etching selection ratio using a KOH solution of the (110) surface of Si is approximately two times greater than that of the (100) surface of Si and, therefore, the silicon substrate 8 having the (110) plane direction is etched so as to expose the (110) surface on the bottom, the (100) and (111) surfaces on the sides by means of etching using a KOH solution, as shown in FIG. 3, and, thereby, the silicon substrate 8 in the form shown in FIG. 2(f) can be gained.

After that, the resist pattern is removed and, thereby, a flexible substrate with the feedthrough electrode is completed as shown in FIG. 2(g).

The flexible substrate gained according to the above described method allows the chip to be treated as a thick film because the rear surface of silicon substrate 8 is not completely converted to a thin film.

Embodiment 3

Figure 4A:
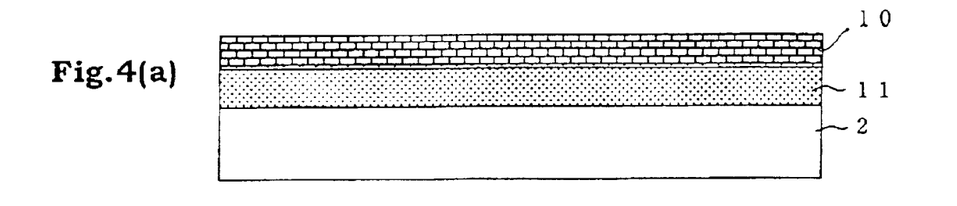
FIGS. 4(a) to 4(f) are schematic cross sectional views of a main portion of a semiconductor device in accordance with the steps of a manufacturing method for a semiconductor device according to a third embodiment of the present invention.

First, as shown in FIG. 4(a), an SOI substrate is used wherein a buried insulating film 11 made of a silicon oxide film and a silicon layer are formed, in this order, on top of, for example, a silicon substrate 2 so that an element layer 10 is fabricated on top of the silicon layer of this SOI substrate in the same manner as described above.

Figure 4B:
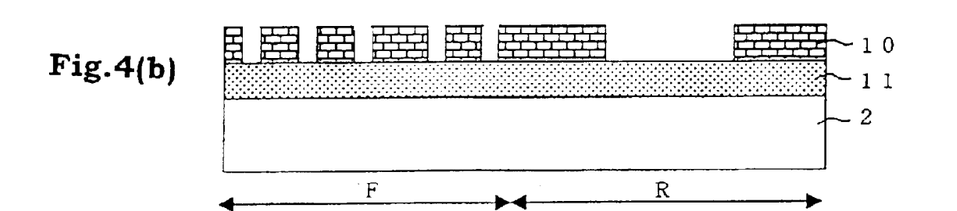

After that, as shown in FIG. 4(b), slits 3 for flexibility and a slit 4 for a feedthrough electrode are created according to, for example, a RIE method so as to have a depth wherein the slits penetrate through the element layer 10.

Figure 4C:
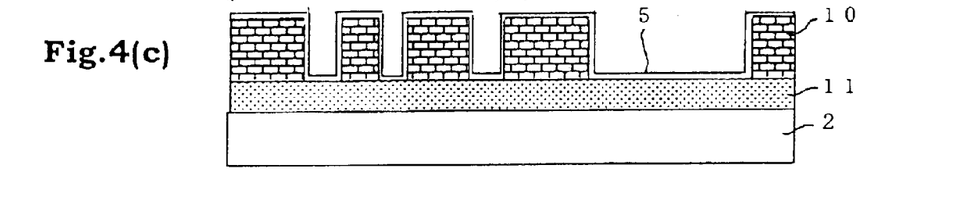
Figure 4D:
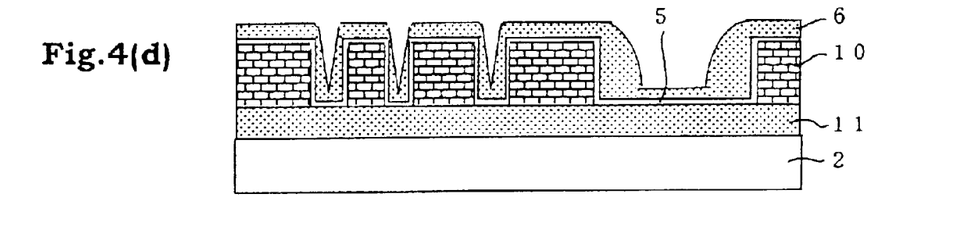

Next, as shown in FIG. 4(c), a SiN film 5 is deposited on the entire surface of the gained substrate according to, for example, a thermal CVD method or a plasma CVD method so as to have a thickness of approximately 0.2 μm and, in addition, a thermal oxide film 6 is formed on top of that so as to have a thickness sufficient to fill in the slits 3 for flexibility and sufficient to be deposited on the sides and on the bottom of the slit 4 for the feedthrough electrode, as shown in FIG. 4(d).

Figure 4E:
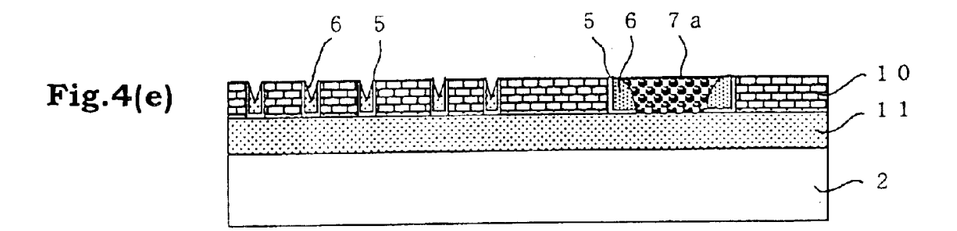

Then, as shown in FIG. 4(e), the thermal oxide film 6 is etched back so as to expose the bottom of the slit 4 for the feedthrough electrode and an aluminum film is filled in into the slit 4 for the feedthrough electrode. Next, the surface of the silicon substrate 2 is polished according to, for example, a CMP method so that the substrate is converted to a thin film and a feedthrough electrode 7a is formed. At this time, the SiN film 5 formed on the surface of the element layer 1 serves as the polishing stopper.

Figure 4F:
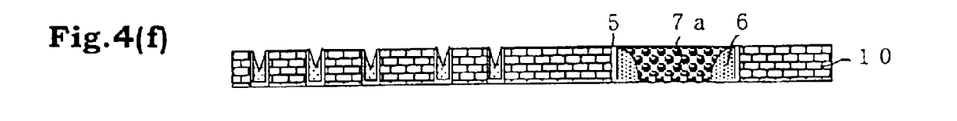

Furthermore, as shown in FIG. 4(f), the element layer is lifted off and, thereby, a flexible substrate with the feedthrough electrode 7a is completed.

According to the present invention, a semiconductor layer and an insulating layer provide a region having flexibility and, thereby, a wearable package that can be bent can be implemented as a system package solution corresponding to the miniaturization and conversion to portability of apparatuses. In addition, such a semiconductor device can be applied to a three dimensional IC and, thereby, it is possible to increase the density of such semiconductor devices mounted on an apparatus and to increase the speed of the system wherein such an apparatus is used.

In particular, in the case wherein feedthrough electrodes are formed, it is possible to implement a layered chip.

In addition, in the case wherein slits are created in the top surface and/or on the rear surface of the flexible region, that is to say, in the case wherein the top surface and/or the rear surface are uneven, the semiconductor layer can be gained as a thick film and, therefore, strong semiconductor devices can be gained while flexibility is maintained and, thereby, handling becomes easy.

Furthermore, according to the present invention, a flexible semiconductor device can be implemented in accordance with a simple method and, therefore, an inexpensive, flexible semiconductor device can be provided so as to allow a wearable computer or a three dimensional IC to be implemented without increase in manufacturing cost.

What is claimed is:

1. A semiconductor device comprising:
   a semiconductor layer and one, or a plurality of, semiconductor elements formed on the semiconductor layer,
   wherein said semiconductor layer is divided into a plurality of pieces in a region wherein said semiconductor layer does not have a semiconductor element and in that the respective pieces of the divided semiconductor layer have a flexible region comprising an insulating layer adhered to the sides of the respective pieces so that the pieces are integrated, and
   a feedthrough electrode extending through the semiconductor layer from a top surface to a bottom surface of the semiconductor layer.

2. The semiconductor device according to claim 1, wherein the respective pieces of the semiconductor layer have inclined sides facing the rear surface side.

3. The semiconductor device according to claim 1, wherein the semiconductor layer is made of a single crystal having the (110) plane direction.

4. A semiconductor device comprising:
   a semiconductor layer and one, or a plurality of, semiconductor elements formed on the semiconductor layer,
   wherein said semiconductor layer is divided into a plurality of pieces in a region wherein said semiconductor layer does not have a semiconductor element and wherein the respective pieces of the divided semiconductor layer have a flexible region comprising an insulating layer adhered to the sides of the respective pieces so that the pieces are integrated; and
   wherein the respective pieces of the divided semiconductor layer have rigid regions integrated via the insulating layer by means of feedthrough electrodes adhering to the insulating layer and extending from the top surface to the rear surface of said semiconductor layer.

5. A semiconductor device, comprising:
   a rigid region wherein one, or a plurality of, semiconductor elements is formed on a surface of a semiconductor layer; and
   a flexible region wherein a semiconductor element is not provided in the surface of said semiconductor layer,
   wherein the flexible region is provided with semiconductor layers and insulating layers adhered to each other in an alternating manner;
   wherein a feedthrough electrode extending from the top surface to the rear surface of the semiconductor layer and electrically separated from said semiconductor layer is further provided in the rigid region.

6. The semiconductor device according to claim 5, wherein a slit is created in the top surface and/or in the rear surface of the flexible region.

7. A semiconductor device comprising:
   a semiconductor layer and one, or a plurality of, semiconductor elements formed on the semiconductor layer,
   wherein said semiconductor layer is divided into a plurality of pieces in a region wherein said semiconductor layer does not have a semiconductor element and wherein the respective pieces of the divided semiconductor layer have a flexible region comprising an insulating layer adhered to the sides of the respective pieces so that the pieces are integrated; and
   wherein the insulating layer has a recess in a surface thereof.

* * * * *